(12) United States Patent
Adachi et al.

(10) Patent No.: US 9,348,224 B2
(45) Date of Patent: *May 24, 2016

(54) PHOTOSENSITIVE RESIN COMPOSITION

(71) Applicant: NISSAN CHEMICAL INDUSTRIES, LTD., Tokyo (JP)

(72) Inventors: Isao Adachi, Funabashi (JP); Takahiro Sakaguchi, Funabashi (JP); Hiroyuki Soda, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/387,992

(22) PCT Filed: Mar. 15, 2013

(86) PCT No.: PCT/JP2013/057447
§ 371 (c)(1),
(2) Date: Sep. 25, 2014

(87) PCT Pub. No.: WO2013/146360
PCT Pub. Date: Oct. 3, 2013

(65) Prior Publication Data
US 2015/0050593 A1 Feb. 19, 2015

(30) Foreign Application Priority Data

Mar. 27, 2012 (JP) .................................. 2012-071805

(51) Int. Cl.
| | |
|---|---|
| C08G 61/12 | (2006.01) |
| C08F 2/46 | (2006.01) |
| C08G 61/04 | (2006.01) |
| G03F 7/023 | (2006.01) |
| G02B 1/04 | (2006.01) |
| G03F 7/40 | (2006.01) |
| G03F 7/038 | (2006.01) |
| C08F 222/40 | (2006.01) |
| G03F 7/00 | (2006.01) |
| G02B 3/00 | (2006.01) |
| C08F 220/32 | (2006.01) |
| C08F 220/36 | (2006.01) |

(52) U.S. Cl.
CPC .............. *G03F 7/038* (2013.01); *C08F 222/40* (2013.01); *G02B 1/041* (2013.01); *G03F 7/0005* (2013.01); *G03F 7/0233* (2013.01); *C08F 220/32* (2013.01); *C08F 220/36* (2013.01); *G02B 1/04* (2013.01); *G02B 3/0012* (2013.01)

(58) Field of Classification Search
None
See application file for complete search history.

(56) References Cited

U.S. PATENT DOCUMENTS

| | | | |
|---|---|---|---|
| 2004/0131967 A1* | 7/2004 | Ozaki | 430/270.1 |
| 2004/0248030 A1* | 12/2004 | Kim et al. | 430/270.1 |
| 2005/0127355 A1* | 6/2005 | Jeong | C08G 61/124 257/40 |
| 2008/0131813 A1* | 6/2008 | Etou et al. | 430/280.1 |
| 2010/0081089 A1* | 4/2010 | Kim et al. | 430/286.1 |
| 2011/0086310 A1* | 4/2011 | Yukawa et al. | 430/270.1 |
| 2012/0181702 A1* | 7/2012 | Lee et al. | 257/774 |
| 2013/0245152 A1* | 9/2013 | Soda et al. | 522/167 |

FOREIGN PATENT DOCUMENTS

| | | |
|---|---|---|
| CN | 101 788 767 A | 7/2010 |
| EP | 1 437 625 A1 | 7/2004 |
| JP | 06-138658 * | 5/1994 |
| JP | 07-005684 * | 1/1995 |

(Continued)

OTHER PUBLICATIONS

Machine translation of JP 2005-049720 (2005).*

(Continued)

*Primary Examiner* — Martin Angebranndt
(74) *Attorney, Agent, or Firm* — Oliff PLC

(57) ABSTRACT

There is provided a photosensitive resin composition. A photosensitive resin composition including a component (A), a component (B); and a solvent, wherein the component (A) is a copolymer having a structural unit of Formula (1) and a structural unit of Formula (2):

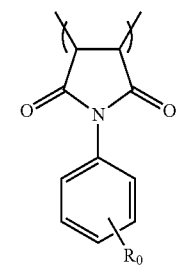

(1)

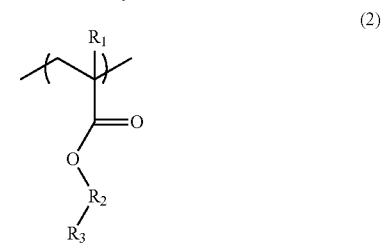

(2)

(where R0 is a hydroxy group or a carboxy group; R1 is a hydrogen atom or a methyl group; R2 is a single bond or a C1-5 alkylene group; R3 is a thermally cross-linkable monovalent organic group; and in a plurality of structural units of Formula (2), R1 are optionally different from each other), and the component (B) is a photosensitizer.

7 Claims, No Drawings

(56) References Cited

FOREIGN PATENT DOCUMENTS

| | | | |
|---|---|---|---|
| JP | 2001-354822 A | | 12/2001 |
| JP | 2004-212752 A | | 7/2004 |
| JP | 2005-049720 A | | 2/2005 |
| JP | 2007-033518 | * | 2/2007 |
| JP | 2007-056151 | * | 3/2007 |
| JP | 2007-056151 A | | 3/2007 |
| JP | 2010-008561 A | | 1/2010 |
| JP | 4462576 B2 | | 5/2010 |
| JP | 2011-180385 | * | 9/2011 |
| WO | 2007/069798 A1 | | 6/2007 |
| WO | 2011/024545 A1 | | 3/2011 |
| WO | 2012/073742 A1 | | 6/2012 |

OTHER PUBLICATIONS

Gouri et al. "Thermosetting film adhesives based upon maleimide-modified-phenol-functional acrylic copolymers", J. Adhes. Sci. Technol., vol. 15(6) pp. 703-726 (2001).*

Jun. 4, 2013 Written Opinion issued in Application No. PCT/JP2013/057447.

Jun. 4, 2013 International Search Report issued in Application No. PCT/JP2013/057447.

Aug. 6, 2015 Extended European Search Report issued in European Patent Application No. 13768760.4.

* cited by examiner

PHOTOSENSITIVE RESIN COMPOSITION

TECHNICAL FIELD

The present invention relates to a photosensitive resin composition. More in detail, the present invention relates to a photosensitive resin composition capable of markedly improving transparency, heat resistance, heat discoloration resistance, and solvent resistance, and capable of being suitably used particularly as a material for forming microlenses.

BACKGROUND ART

In recent years, high definition CCD/CMOS image sensors have been developed and this requires the enhancement of the sensitivity of the sensors. Thus, for microlenses that are loaded in the sensors, high transparency and high heat resistance are required. A conventionally known material for forming microlenses is polyhydroxystyrene. However, there is a room for improvement in the polyhydroxystyrene due to the following disadvantages. In microlenses formed using the polyhydroxystyrene as a forming material, the lens shape is easily changed by heating at high temperatures, so that it is difficult to form microlenses having a stable shape. In addition, such microlenses are easily colored and are likely to have impaired transparency by heating at high temperatures, and thus coloring of such microlenses may be recognized in use.

On the other hand, a photosensitive resin composition is known that is produced using, instead of polyhydroxystyrene, for example, a copolymer having a structural unit derived from maleimide as disclosed in Patent Document 1 and Patent Document 2. It is also known that the composition is used for forming microlenses or insulating films.

PRIOR ART DOCUMENTS

Patent Documents

Patent Document 1: Japanese Patent Application Publication No. 2001-354822 (JP 2001-354822 A)
Patent Document 2: Japanese Patent No. 4462576

SUMMARY OF THE INVENTION

Problem to be Solved by the Invention

The present invention has been made according to the above circumstances and it is an object of the present invention to provide a photosensitive resin composition capable of markedly improving transparency, heat resistance, heat discoloration resistance, solvent resistance, and patterning properties.

Means for Solving the Problem

As a result of intensive studies for solving the above problems, the inventors of the present invention have completed the present invention.

Specifically, the present invention provides, according to a first aspect, a photosensitive resin composition comprising: a component (A); a component (B); and a solvent, in which the component (A) is a copolymer having a structural unit of Formula (1) and a structural unit of Formula (2):

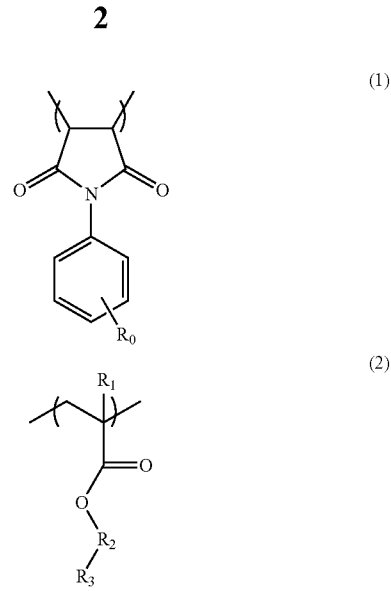

(where $R_0$ is a hydroxy group or a carboxy group; $R_1$ is a hydrogen atom or a methyl group; $R_2$ is a single bond or a $C_{1-5}$ alkylene group; $R_3$ is a thermally cross-linkable monovalent organic group; and in a plurality of structural units of Formula (2), $R_1$ are optionally different from each other), and the component (B) is a photosensitizer.

The present invention provides, according to a second aspect, the photosensitive resin composition according to the first aspect, in which the thermally cross-linkable monovalent organic group includes an epoxy group or a blocked isocyanate group.

The present invention provides, according to a third aspect, the photosensitive resin composition according to the first aspect or the second aspect, in which the component (A) is a copolymer further having a structural unit of Formula (3):

(where Y is a phenyl group, a naphthyl group, a biphenylyl group, or a $C_{1-8}$ alkoxy group; and in the phenyl group, the naphthyl group, and the biphenylyl group, some or all hydrogen atoms are optionally substituted by $C_{1-10}$ alkyl groups or halogen atoms).

The present invention provides, according to a fourth aspect, the photosensitive resin composition according to any one of the first aspect to the third aspect, further comprising a cross-linking agent as a component (C).

The present invention provides, according to a fifth aspect, the photosensitive resin composition according to any one of the first aspect to the fourth aspect, in which the copolymer has a weight average molecular weight of 1,000 to 50,000.

The present invention provides, according to a sixth aspect, a cured film obtained from the photosensitive resin composition as described in any one of the first aspect to the fifth aspect.

The present invention provides, according to a seventh aspect, a microlens produced from the photosensitive resin composition as described in any one of the first aspect to the fifth aspect.

Effects of the Invention

A film formed from the photosensitive resin composition of the present invention can have excellent transparency, heat resistance, heat discoloration resistance, and solvent resistance. A pattern formed from the photosensitive resin composition of the present invention can also have excellent heat resistance. Thus, a film formed from the photosensitive resin composition of the present invention can markedly reduce the possibility of coloring of microlenses and deformation of the lens shape by heat treatment at high temperatures in a process of forming the film or a process of forming a peripheral device such as wiring. The photosensitive resin composition of the present invention can also markedly reduce disadvantages such as the deformation and the exfoliation of microlenses by organic solvents when a process of forming an electrode and a process of forming wiring are performed after the formation of the microlenses. Therefore, the photosensitive resin composition of the present invention is suitable for the material for forming microlenses.

MODES FOR CARRYING OUT THE INVENTION

Each component of the photosensitive resin composition of the present invention will be described in detail. The solid content that is the content except a solvent in the photosensitive resin composition of the present invention is typically 1% by mass to 50% by mass.

<Component (A)>

The component (A) of the present invention is a copolymer having a structural unit of Formula (1) and a structural unit of Formula (2):

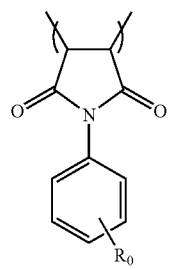

(1)

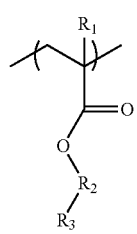

(2)

(where $R_0$ is a hydroxy group or a carboxy group; $R_1$ is a hydrogen atom or a methyl group; $R_2$ is a single bond or a $C_{1-5}$ alkylene group; $R_3$ is a thermally cross-linkable monovalent organic group; and in a plurality of structural units of Formula (2), $R_1$ may be different from each other).

The thermally cross-linkable monovalent organic group $R_3$ preferably includes an epoxy group or a blocked isocyanate group. $R_3$ is more preferably an organic group including an epoxy group, which can suppress, for example, film shrinkage caused by heat treatment.

The organic group including an epoxy group may include a non-alicyclic structure or an alicyclic structure. Specific examples of the structural unit of Formula (2) in which $R_3$ is an organic group including an epoxy group include a structural unit of Formula (4) below when the organic group including an epoxy group has a non-alicyclic structure and a structural unit of Formula (5) below when the organic group including an epoxy group has an alicyclic structure.

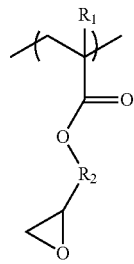

(4)

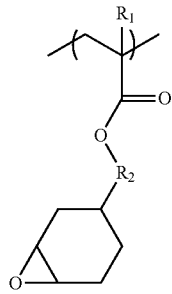

(5)

(in Formula (4) and Formula (5), each $R_1$ is independently a hydrogen atom or a methyl group and each $R_2$ is independently a single bond or a $C_{1-5}$ alkylene group; and $R_1$ is preferably a methyl group and $R_2$ is preferably a methylene group).

The blocked isocyanate group is one in which an isocyanate group (—N=C=O) is blocked with an appropriate protective group. Examples of a blocking agent include: alcohols such as methanol, ethanol, isopropanol, n-butanol, 2-ethoxyhexanol, 2-N,N-dimethylaminoethanol, 2-ethoxyethanol, and cyclohexanol; phenols such as phenol, o-nitrophenol, p-chlorophenol, o-cresol, m-cresol, and p-cresol; lactams such as ε-caprolactam; oximes such as acetone oxime, methyl ethyl ketone oxime, methyl isobutyl ketone oxime, cyclohexanone oxime, acetophenone oxime, and benzophenone oxime; pyrazoles such as pyrazole, 3,5-dimethylpyrazole, and 3-methylpyrazole; and thiols such as dodecanethiol and benzenethiol.

Examples of the structural unit of Formula (2) in which $R_3$ is an organic group including a blocked isocyanate group include a structural unit of Formula (6) below and a structural unit of Formula (7) below, and from the viewpoint of the desorption temperature of a blocking agent, the structural unit of Formula (7) is preferred.

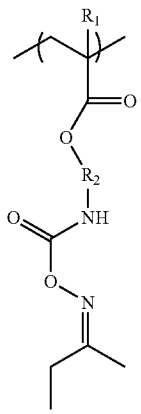

(6)

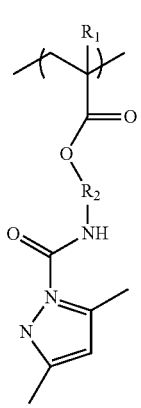

(7)

(in Formula (6) and Formula (7), each $R_1$ is independently a hydrogen atom or a methyl group and each $R_2$ is independently a single bond or a $C_{1-5}$ alkylene group; and $R_1$ is preferably a methyl group and $R_2$ is preferably an ethylene group).

Further, the component (A) may be a copolymer having a structural unit of Formula (3):

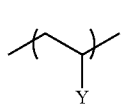

(3)

(where Y is a phenyl group, a naphthyl group, a biphenylyl group, or a $C_{1-8}$ alkoxy group, and in the phenyl group, the naphthyl group, and the biphenylyl group, some or all hydrogen atoms may be substituted by $C_{1-10}$ alkyl groups or halogen atoms).

The content of the structural unit of Formula (1) in the copolymer of the component (A) is, for example, 10% by mol to 90% by mol and preferably 20% by mol to 70% by mol. The content of the structural unit of Formula (2) in the copolymer of the component (A) is, for example, 10% by mol to 90% by mol and preferably 20% by mol to 70% by mol. When the copolymer of the component (A) further contains the structural unit of Formula (3), the content of the structural unit of Formula (3) is, for example, 10% by mol to 90% by mol and preferably 20% by mol to 70% by mol.

The copolymer has a weight average molecular weight of typically 1,000 to 50,000 and preferably 1,500 to 30,000. The weight average molecular weight is a value measured by gel permeation chromatography (GPC) using polystyrene as a standard sample.

The content of the component (A) in the photosensitive resin composition of the present invention is typically 1% by mass to 99% by mass and preferably 10% by mass to 95% by mass, based on the content in the solid content of the photosensitive resin composition.

In the present invention, although the method for obtaining the component (A) is not particularly limited, the component (A) can be commonly obtained by a polymerization reaction of a monomer mixture containing monomer species used for obtaining the copolymer in a polymerization solvent typically at a temperature of 50° C. to 110° C.

<Component (B)>

The photosensitizer as the component (B) of the present invention is not particularly limited so long as the photosensitizer is a compound capable of being used as a photosensitizing component. The photosensitizer is preferably a 1,2-naphtoquinone diazide compound. As the 1,2-naphtoquinone diazide compound, a compound having a hydroxy group in which, for example, 10% by mol to 100% by mol and preferably 20% by mol to 95% by mol of such hydroxy groups are esterified with 1,2-naphthoquinone diazide sulfonic acid, can be used.

Examples of the compound having a hydroxy group include: phenolic compounds such as phenol, o-cresol, m-cresol, p-cresol, hydroquinone, resorcinol, catechol, methyl gallate, ethyl gallate, 1,3,3-tris(4-hydroxyphenyl)butane, 4,4'-isopropylidene diphenol, 1,1-bis(4-hydroxyphenyl)cyclohexane, 4,4'-dihydroxydiphenylsulfone, 4,4'-(hexafluoroisopropylidene)diphenol, 4,4',4"-trishydroxyphenylethane, 1,1,1-trishydroxyphenylethane, 4,4'-[1-[4-[1-(4-hydroxyphenyl)-1-methylethyl]phenyl]ethylidene]bisphenol, 2,4-dihydroxybenzophenone, 2,3,4-trihydroxybenzophenone, 2,2',4,4'-tetrahydroxybenzophenone, 2,3,4,4'-tetrahydroxybenzophenone, and 2,2',3,4,4'-pentahydroxybenzophenone; and aliphatic alcohols such as ethanol, 2-propanol, 4-butanol, cyclohexanol, ethylene glycol, propylene glycol, diethylene glycol, dipropylene glycol, 2-methoxyethanol, 2-butoxyethanol, 2-methoxypropanol, 2-butoxypropanol, ethyl lactate, and butyl lactate.

These photosensitizers may be used individually or in combination of two or more types of them.

The content of the component (B) in the photosensitive resin composition of the present invention is typically 1% by mass to 50% by mass, based on the content in the solid content of the photosensitive resin composition.

The photosensitive resin composition of the present invention may also comprise a cross-linking agent as a component (C). The cross-linking agent as the component (C) in the present invention is a compound forming bonds to a blended composition such as a resin and a photosensitizer or the molecules of other cross-linking agents by the action of heat or an acid. Examples of the cross-linking agent include a polyfunctional (meth)acrylate compound, an epoxy compound, a hydroxymethyl group-substituted phenolic compound, and a compound having an alkoxyalkylated amino group. These cross-linking agents may be used individually or in combination of two or more types of them.

Examples of the polyfunctional (meth)acrylate compound include trimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, glycerin tri(meth)acrylate, tris(2-hydroxyethyl)isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentyl glycol di(meth)acrylate, diethylene glycol di(meth)acrylate, triethylene glycol di(meth)acrylate, dipropylene glycol di(meth)acrylate, and bis(2-hydroxyethyl)isocyanurate di(meth)acrylate.

Examples of the epoxy compound include the following commercial products but are not limited to these examples. Examples of a bisphenol A-type epoxy resin include: jER (registered trademark) 828, 834, 1001, and 1004 (manufactured by Mitsubishi Chemical Corporation); and EPICLON (registered trademark) 850, 860, and 4055 (manufactured by DIC Corporation). Examples of a bisphenol F-type epoxy resin include: jER (registered trademark) 807 (manufactured by Mitsubishi Chemical Corporation); and EPICLON (registered trademark) 830 (manufactured by DIC Corporation). Examples of a phenol novolac-type epoxy resin include: EPICLON (registered trademark) N-740, N-770, and N-775

(manufactured by DIC Corporation); and jER (registered trademark) 152 and 154 (manufactured by Mitsubishi Chemical Corporation). Examples of a cresol novolac-type epoxy resin include: EPICLON (registered trademark) N-660, N-665, N-670, N-673, N-680, N-695, N-665-EXP; and N-672-EXP (manufactured by DIC Corporation). Examples of a glycidylamine-type epoxy resin include: EPICLON (registered trademark) 430 and 430-L (manufactured by DIC Corporation); TETRAD (registered trademark)-C and TETRAD (registered trademark)-X (manufactured by Mitsubishi Gas Chemical Company, Inc.); jER (registered trademark) 604 and 630 (manufactured by Mitsubishi Chemical Corporation); SUMIEPDXY (registered trademark) ELM120, ELM100, ELM434, and ELM434HV (manufactured by Sumitomo Chemical Co., Ltd.); and Epotohto (registered trademark) YH-434 and YH-434L (manufactured by NSCC Epoxy Manufacturing Co., Ltd. (formerly Tohto Kasei Co., Ltd.)). Examples of an alicyclic epoxy resin include: DENACOL (registered trademark) EX-252 (manufactured by Nagase ChemteX Corporation); EPICLON (registered trademark) 200 and 400 (manufactured by DIC Corporation); and jER (registered trademark) 871 and 872 (manufactured by Mitsubishi Chemical Corporation). Examples of an epoxy resin having a cyclohexene oxide structure include: EPOLEAD (registered trademark) GT-401, GT-403, GT-301, and GT-302; and CELLOXIDE (registered trademark) 2021 and 3000 (manufactured by Daicel Corporation).

Examples of the hydroxymethyl group-substituted phenolic compound include 2,6-dihydroxymethyl-4-methylphenol, 2,4-dihydroxymethyl-6-methylphenol, bis(2-hydroxy-3-hydroxymethyl-5-methylphenyl)methane, bis(4-hydroxy-3-hydroxymethyl-5-methylphenyl)methane, and 2,2-bis(4-hydroxy-3,5-dihydroxymethylphenyl)propane.

Examples of the compound having an alkoxyalkylated amino group include nitrogen-containing compounds having a plurality of active methylol groups in one molecule thereof in which at least one hydrogen atom of hydroxy groups of the methylol groups is substituted by an alkyl group such as a methyl group and a butyl group, such as (poly)methylolated melamine, (poly)methylolated glycoluril, (poly)methylolated benzoguanamine, and (poly)methylolated urea.

The compound having an alkoxyalkylated amino group may be a mixture containing a plurality of substituted compounds. A mixture containing some oligomer components formed by self-condensation also exists and such a mixture can also be used. Specific examples thereof include: CYMEL series products such as hexamethoxymethylmelamine (manufactured by Nihon Cytec Industries Inc.; CYMEL (registered trademark) 303), tetrabutoxymethylglycoluril (manufactured by Nihon Cytec Industries Inc., CYMEL (registered trademark) 1170), and tetramethoxymethylbenzoguanamine (manufactured by Nihon Cytec Industries Inc.; CYMEL (registered trademark) 1123); and NIKALAC series products such as methylated melamine resins (manufactured by SANWA CHEMICAL CO., LTD.; NIKALAC (registered trademark) MW-30HM, MW-390, MW-100LM, and MX-750LM) and methylated urea resins (manufactured by SANWA CHEMICAL CO., LTD., NIKALAC (registered trademark) MX-270, MX-280, and MX-290).

The content of the component (C) in the photosensitive resin composition of the present invention is typically 1% by mass to 50% by mass, based on the content in the solid content of the photosensitive resin composition for microlenses.

Although the preparation method of the photosensitive resin composition of the present invention is not particularly limited, examples of the preparation method include a method in which a copolymer as the component (A) is dissolved in a solvent; and to the resultant solution, a photosensitizer as the component (B) and, if necessary, a cross-linking agent as the component (C) are mixed at a predetermined ratio to prepare a homogeneous solution. Examples of the preparation method further include a method in which if necessary, other additives are further added to the composition and the resultant mixture is mixed at an appropriate step in the above preparation method.

The solvent is not particularly limited so long as the solvent can dissolve the component (A), the component (B), and the component (C). Examples of such a solvent include ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, propylene glycol monobutyl ether, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl acetate, butyl acetate, ethyl lactate, butyl lactate, 2-heptanone, and γ-butyrolactone.

These solvents may be used individually or in combination of two or more types of them.

Among these solvents, from the viewpoint of enhancing the leveling properties of the coating film, propylene glycol monomethyl ether, propylene glycol monomethyl ether acetate, 2-heptanone, ethyl lactate, butyl lactate, and cyclohexanone are preferred.

The photosensitive resin composition of the present invention may also contain a surfactant for the purpose of enhancing the coating properties. Examples of the surfactant include: nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorinated surfactants, for example, EFTOP (registered trademark) EF301, EF303, and EF352 (manufactured by Mitsubishi Materials Electronic Chemicals Co., Ltd.), MEGAFAC (registered trademark) F171, F173, and R30 (manufactured by DIC Corporation), Fluorad FC430 and FC431 (manufactured by Sumitomo 3M Limited), AsahiGuard (registered trademark) AG710, Surflon (registered trademark) S-382, SC101, SC102, SC103, SC104, SC105, and SC106 (manufactured by Asahi Glass Co., Ltd.), and FTERGENT series products such as FTX-206D, FTX-212D, FTX-218, FTX-220D, FTX-230D, FTX-240D, FTX-212P, FTX-220P, FTX-228P, and FTX-240G (manufactured by NEOS COMPANY LIMITED); and Organosiloxane polymer KP341 (manufactured by Shin-Etsu Chemical Co., Ltd.).

These surfactants may be used individually or in combination of two or more types of them.

When any of the surfactants is used, the content of the surfactant in the photosensitive resin composition of the present invention is, for example, 3% by mass or less, preferably 1% by mass or less, and more preferably 0.5% by mass or less, based on the content in the solid content of the photosensitive resin composition.

The photosensitive resin composition of the present invention may contain additives such as a curing auxiliary agent, an ultraviolet absorber, a sensitizer, a plasticizer, an antioxidant, and a bonding auxiliary agent, as necessary, unless the advantageous effects of the present invention are impaired.

The use of the photosensitive resin composition of the present invention will be described below.

Onto a substrate {for example, a semiconductor substrate such as silicon coated with a silicon oxide film, a semiconductor substrate such as silicon coated with a silicon nitride film or a silicon oxynitride film, a silicon nitride substrate, a quartz substrate, a glass substrate (including non-alkali glass, low-alkali glass, or crystallized glass), and a glass substrate on which an ITO film is formed}, the photosensitive resin composition of the present invention is applied by an appropriate coating method with, for example, a spinner and a coater, and then is pre-baked by a heating means such as a hot plate to form a coating film.

The conditions for the pre-bake are appropriately selected from baking temperatures of 80° C. to 250° C. and baking times of 0.3 minutes to 60 minutes and are preferably a baking temperature of 80° C. to 150° C. and a baking time of 0.5 minutes to 5 minutes.

A film formed from the photosensitive resin composition of the present invention has a film thickness of, for example, 0.005 μm to 3.0 μm and preferably 0.01 μm to 1.0 μm.

Then, on the film obtained above, exposure is performed through a mask (reticle) for forming a predetermined pattern. For the exposure, for example, a g-line, an i-line, a KrF excimer laser, or an ArF excimer laser may be employed. After the exposure, if necessary, post exposure bake is performed. The conditions for the post exposure bake are appropriately selected from heating temperatures of 80° C. to 150° C. and heating times of 0.3 minutes to 60 minutes. The film is then developed with an alkaline developer.

Examples of the alkaline developer include alkaline aqueous solutions such as: an aqueous solution of an alkali metal hydroxide such as potassium hydroxide and sodium hydroxide; an aqueous solution of a quaternary ammonium hydroxide such as tetramethylammonium hydroxide, tetraethylammonium hydroxide, and choline; and an aqueous solution of an amine such as ethanolamine, propylamine, and ethylenediamine. A surfactant may be added to these developers.

The conditions for the development are appropriately selected from development temperatures of 5° C. to 50° C. and development times of 10 seconds to 300 seconds. The film formed from the photosensitive resin composition of the present invention can easily be developed at room temperature using a tetramethylammonium hydroxide aqueous solution. After the development, the film is rinsed, for example, using ultrapure water.

The whole surface of the substrate is further exposed using, for example, a g-line, an i-line, a KrF excimer laser, or an ArF excimer laser. The substrate is then subjected to the post-bake using a heating means such as a hot plate. The conditions for the post-bake are appropriately selected from baking temperatures of 100° C. to 250° C. and baking times of 0.5 minutes to 60 minutes.

EXAMPLES

The present invention will be described hereinafter more in detail referring to examples and comparative examples which should not be construed as limiting the scope of the present invention.

[Measurement of Weight Average Molecular Weight of Polymer Obtained in Synthesis Examples Below]
Apparatus: GPC system manufactured by JASCO Corporation
Column: Shodex (registered trademark) KF-804L and 803L
Column oven: 40° C.
Flow rate: 1 mL/min
Eluent: Tetrahydrofuran Synthesis of Polymer Synthesis Example 1

15.0 g of N-(4-hydroxyphenyl)maleimide (also called: 1-(4-hydroxyphenyl)-2,5-dioxo-pyrrole; manufactured by AstaTech, Inc.), 23.3 g of 3,4-epoxycyclohexylmethyl methacrylate (Cyclomer (registered trademark) M100; manufactured by Daicel Corporation), and 1.63 g of 2,2'-azobisisobutyronitrile were dissolved in 120.0 g of propylene glycol monomethyl ether. The resultant solution was added dropwise into a flask in which 40.0 g of propylene glycol monomethyl ether was maintained at 80° C., over 4 hours. After the completion of the dropwise addition, the reaction was effected for 18 hours. The reaction solution was cooled down to room temperature and then was charged into a solvent mixture of pure water/methanol (mass ratio: 50/50) to reprecipitate a polymer. The precipitate was dried under reduced pressure to obtain a polymer (copolymer) having a structural unit of Formula (10) below. The obtained polymer had a weight average molecular weight Mw of 6,200 (in terms of polystyrene).

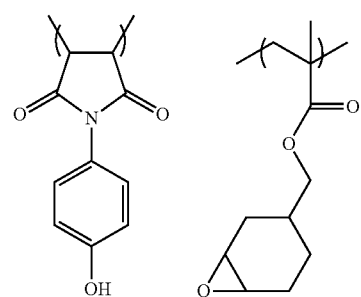

(10)

Synthesis Example 2

5.0 g of N-(4-hydroxyphenyl)maleimide (manufactured by AstaTech, Inc.), 3.9 g of 3,4-epoxycyclohexylmethyl methacrylate (Cyclomer (registered trademark) M100; manufactured by Daicel Corporation), 3.2 g of 4-tert-butylstyrene, and 0.7 g of 2,2'-azobisisobutyronitrile were dissolved in 51.1 g of propylene glycol monomethyl ether. The resultant solution was added dropwise into a flask in which 21.3 g of propylene glycol monomethyl ether was maintained at 90° C., over 3 hours. After the completion of the dropwise addition, the reaction was effected for 12 hours. The reaction solution was cooled down to room temperature and then was charged into a solvent mixture of pure water/methanol (mass ratio: 50/50)

to reprecipitate a polymer. The precipitate was dried under reduced pressure to obtain a polymer (copolymer) having a structural unit of Formula (11) below. The obtained polymer had a weight average molecular weight Mw of 7,700 (in terms of polystyrene).

dried under reduced pressure to obtain a polymer (copolymer) having a structural unit of Formula (13) below. The obtained polymer had a weight average molecular weight Mw of 8,300 (in terms of polystyrene).

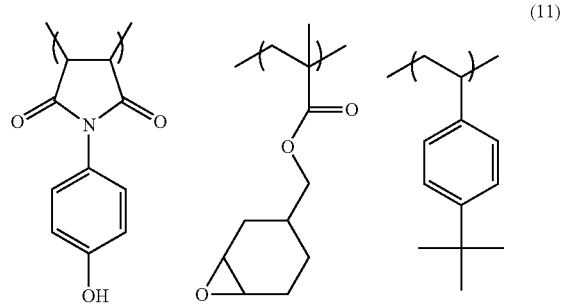

(11)

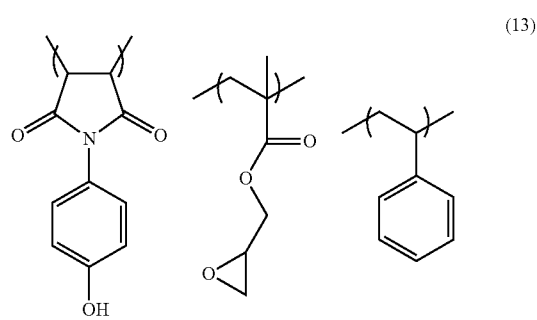

(13)

Synthesis Example 3

3.0 g of N-(4-hydroxyphenyl)maleimide (manufactured by AstaTech, Inc.), 1.4 g of glycidyl methacrylate, 2.2 g of 4-tert-butylstyrene, and 0.4 g of 2,2'-azobisisobutyronitrile were dissolved in 28.1 g of propylene glycol monomethyl ether. The resultant solution was added dropwise into a flask in which 11.7 g of propylene glycol monomethyl ether was maintained at 90° C., over 3 hours. After the completion of the dropwise addition, the reaction was effected for 12 hours. The reaction solution was cooled down to room temperature and then was charged into a solvent mixture of pure water/methanol (mass ratio: 50/50) to reprecipitate a polymer. The precipitate was dried under reduced pressure to obtain a polymer (copolymer) having a structural unit of Formula (12) below. The obtained polymer had a weight average molecular weight Mw of 5,400 (in terms of polystyrene).

Synthesis Example 5

5.0 g of N-(4-hydroxyphenyl)maleimide (manufactured by AstaTech, Inc.), 3.2 g of 2-[(3,5-dimethylpyrazolyl)carbonylamino]ethyl methacrylate (Karenz (registered trademark) MOI-BP; manufactured by Showa Denko K.K.), 5.3 g of 4-tert-butylstyrene, and 0.2 g of 2,2'-azobisisobutyronitrile were dissolved in 41.1 g of propylene glycol monomethyl ether. The resultant solution was added dropwise into a flask in which 13.7 g of propylene glycol monomethyl ether was maintained at 80° C., over 3 hours. After the completion of the dropwise addition, the reaction was effected for 12 hours. The reaction solution was cooled down to room temperature and then was charged into a solvent mixture of pure water/methanol (mass ratio: 50/50) to reprecipitate a polymer. The precipitate was dried under reduced pressure to obtain a polymer (copolymer) having a structural unit of Formula (14) below. The obtained polymer had a weight average molecular weight Mw of 13,000 (in terms of polystyrene).

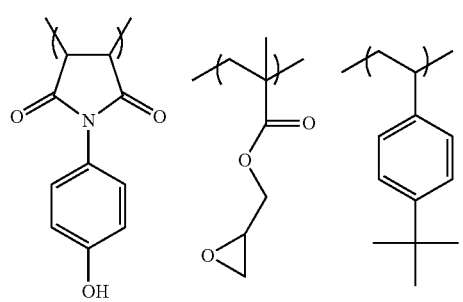

(12)

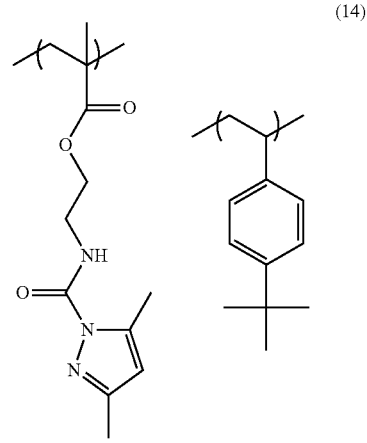

(14)

Synthesis Example 4

5.0 g of N-(4-hydroxyphenyl)maleimide (manufactured by AstaTech, Inc.), 3.8 g of glycidyl methacrylate, 3.7 g of styrene, and 0.4 g of 2,2'-azobisisobutyronitrile were dissolved in 51.4 g of propylene glycol monomethyl ether. The resultant solution was added dropwise into a flask in which 21.4 g of propylene glycol monomethyl ether was maintained at 90° C., over 3 hours. After the completion of the dropwise addition, the reaction was effected for 12 hours. The reaction solution was cooled down to room temperature and then was charged into a solvent mixture of pure water/methanol (mass ratio: 50/50) to reprecipitate a polymer. The precipitate was Preparation of Photosensitive Resin Composition Solution Example 1

2 g of the polymer as the component (A) obtained in Synthesis Example 1, 0.6 g of P-200 (manufactured by Toyo Gosei Co., Ltd.) as a photosensitizer of the component (B), and 0.005 g of MEGAFAC (registered trademark) R-30 (manufactured by DIC Corporation) as a surfactant were dissolved in 13.4 g of propylene glycol monomethyl ether and 5.7 g of propylene glycol monomethyl ether acetate to prepare a solution. The solution was then filtered using a polyethylene microfilter having a pore diameter of 0.20 μm to prepare a photosensitive resin composition.

Example 2

A photosensitive resin composition was prepared in the same condition as that in Example 1 except that 2 g of the polymer obtained in Synthesis Example 2 was used as the component (A).

Example 3

A photosensitive resin composition was prepared in the same condition as that in Example 1 except that 2 g of the polymer obtained in Synthesis Example 3 was used as the component (A).

Example 4

A photosensitive resin composition was prepared in the same condition as that in Example 1 except that 2 g of the polymer obtained in Synthesis Example 4 was used as the component (A).

Example 5

A photosensitive resin composition was prepared in the same condition as that in Example 1 except that 2 g of the polymer obtained in Synthesis Example 5 was used as the component (A).

Comparative Example 1

9 g of poly(4-vinylphenol) (manufactured by Sigma-Aldrich Japan; weight average molecular weight: 20,000) having a structural unit of Formula (15) below, 2.7 g of P-200 (manufactured by Toyo Gosei Co., Ltd.) as a photosensitizer, 1.4 g of CYMEL (registered trademark) 303 (Nihon Cytec Industries Inc.) as a cross-linking agent, and 0.03 g of MEGAFAC (registered trademark) R-30 (manufactured by DIC Corporation) as a surfactant were dissolved in 46.0 g of propylene glycol monomethyl ether and 19.7 g of ethyl lactate to prepare a solution. The solution was then filtered using a polyethylene microfilter having a pore diameter of 0.10 μm to prepare a photosensitive resin composition.

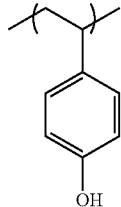

(15)

[Measurement of Transmittance]

Each of the photosensitive resin compositions prepared in Example 1 to Example 5 and Comparative Example 1 was applied onto a quartz substrate using a spin coater and was pre-baked on a hot plate (at 110° C. in the use of the photosensitive resin compositions prepared in Example 1 to Example 4 and Comparative Example 1, or at 90° C. in the use of the photosensitive resin composition prepared in Example 5) for 3 minutes. Then, the whole surface of the substrate was irradiated with ultraviolet rays having an irradiation amount of 500 mJ/cm$^2$ at 365 nm using an ultraviolet irradiation apparatus PLA-501 (F) (manufactured by Canon Inc.) (photobleaching). The substrate was then post-baked on a hot plate (first, the substrate was baked at 160° C. for 5 minutes; next, the substrate was baked at 200° C. for 5 minutes) to form a film having a thickness of 600 nm. The transmittance of the film at a wavelength of 400 nm was measured using an ultraviolet-visible spectrophotometer UV-2550 (manufactured by Shimadzu Corporation). The film was further heated at 260° C. for 5 minutes and then, the transmittance at a wavelength of 400 nm was measured. Table 1 lists the evaluation results.

TABLE 1

| | Transmittance/% (400 nm) | |
|---|---|---|
| | 160° C. + 200° C. | 260° C. |
| Example 1 | 98 | 98 |
| Example 2 | 99 | 98 |
| Example 3 | 99 | 99 |
| Example 4 | 98 | 98 |
| Example 5 | 97 | 96 |
| Comparative Example 1 | 95 | ≤78 |

The results in Table 1 reveal that each of the films formed from the photosensitive resin compositions of the present invention had high heat resistance and was hardly colored even after the heating at 260° C. In contrast, the film formed from the photosensitive resin composition prepared in Comparative Example 1 had a film transmittance of 95% after the post-bake but had a reduced film transmittance of 78% or less after the additional heating at 260° C. for 5 minutes. A film transmittance is commonly required to be 90% or more and the transmittance is desired to satisfy the requirement that the transmittance hardly changes even after heating. The result from Comparative Example 1 failed to satisfy the requirement.

[Patterning Test]

Each of the photosensitive resin compositions prepared in Example 1 to Example 5 was applied onto a silicon wafer using a spin coater and was pre-baked on a hot plate (at 110° C. in the use of the photosensitive resin compositions prepared in Example 1 to Example 4, or at 90° C. in the use of the photosensitive resin composition prepared in Example 5) for 90 seconds to form a photosensitive resin film having a film thickness of 600 nm. Then, the film was exposed through a gray scale mask using an i-line stepper NSR-2205i12D (NA=0.63) (manufactured by Nikon Corporation). The film was then subjected to post exposure bake (PEB) on a hot plate (at 110° C. in the use of the photosensitive resin compositions prepared in Example 1 to Example 4, or at 90° C. in the use of the photosensitive resin composition prepared in Example 5) for 90 seconds, and was developed for 60 seconds with a tetramethylammonium hydroxide (TMAH) aqueous solution (in which the concentration was 1.0% by mass in the use of the photosensitive resin composition prepared in Example 1, or was 2.38% by mass in the use of the photosensitive resin compositions prepared in Examples 2 to 5). The film was rinsed with ultrapure water for 20 seconds and was dried to form a lens pattern having a diameter of 2.0 μm. The whole surface of the silicon wafer in which the lens pattern was formed was further irradiated with an i-line at 500 mJ/cm$^2$ using the i-line stepper (photobleaching). The film was post-baked on a hot plate (first, the film was baked at 160° C. for 5 minutes; next, the film was baked at 200° C. for 5 minutes). The lens pattern was further heated at 260° C. for 5 minutes. Each lens pattern shape was observed under a scanning electron microscope S-4800 (manufactured by Hitachi High-Technologies Corporation) after the development, the rinse, and the drying, after the post-bake, and after the heating at 260° C. It was confirmed that in the use of any of the photosensitive resin compositions prepared in Example 1 to Example 5, a lens pattern shape after the post-bake and the heating at 260° C. maintained a lens pattern shape after the development, the rinse, and the drying.

[Elution Test into Photoresist Solvent]

Each of the photosensitive resin compositions prepared in Example 1 to Example 5 was applied onto a silicon wafer using a spin coater and was pre-baked on a hot plate (at 110° C. in the use of the photosensitive resin compositions prepared in Example 1 to Example 4, or at 90° C. in the use of the photosensitive resin composition prepared in Example 5) for 3 minutes. Then, the whole surface of the silicon wafer onto which the photosensitive resin composition was applied was irradiated with ultraviolet rays having an irradiation amount of 500 mJ/cm$^2$ at 365 nm using an ultraviolet irradiation apparatus PLA-501 (F) (manufactured by Canon Inc.) (photobleaching). The silicon wafer was then post-baked on a hot plate (first, the silicon wafer was baked at 160° C. for 5 minutes; next, the silicon wafer was baked at 200° C. for 5 minutes) to form a film having a thickness of 600 nm. These films were immersed in each of acetone and N-methylpyrrolidone at 23° C. for 10 minutes. It was confirmed that the film thickness change in each of the films formed from the photosensitive resin compositions prepared in Example 1 to Example 5 was 10% or less before and after the immersion in each of the above solvents.

The invention claimed is:

1. A photosensitive resin composition comprising:
a component (A);
a component (B); and
a solvent, wherein
the component (A) is a copolymer consisting essentially of a structural unit of Formula (1), a structural unit of Formula (2), and a structural unit of Formula (3):

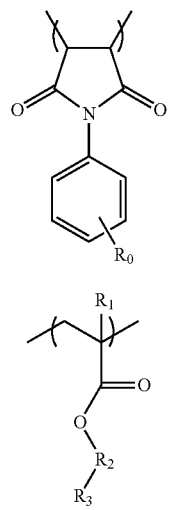

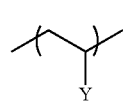

where
$R_0$ is a hydroxy group or a carboxy group;
$R_1$ is a hydrogen atom or a methyl group;
$R_2$ is a single bond or a $C_{1-5}$ alkylene group;
$R_3$ is a thermally cross-linkable monovalent organic group including an epoxy group;
Y is a phenyl group, wherein in the phenyl group, one hydrogen atom is substituted by a tert-butyl group; and
in a plurality of structural units of Formula (2), $R_1$ are optionally different from each other, and
the component (B) is a photosensitizer.

2. The photosensitive resin composition according to claim 1, further comprising
a cross-linking agent as a component (C).

3. The photosensitive resin composition according to claim 1, wherein
the copolymer has a weight average molecular weight of 1,000 to 50,000.

4. A cured film obtained from the photosensitive resin composition as claimed in claim 1.

5. A microlens produced from the photosensitive resin composition as claimed in claim 1.

6. The photosensitive resin composition according to claim 1, wherein the structural units of the copolymer are represented by Formula (11):

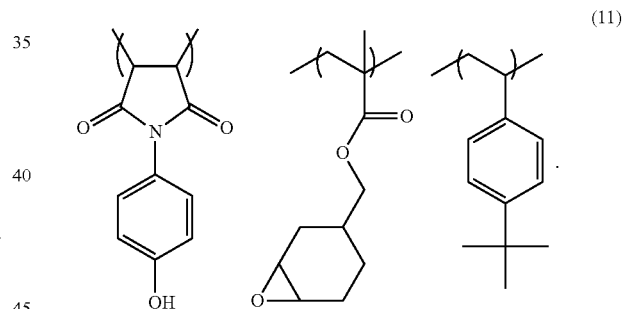

7. The photosensitive resin composition according to claim 1, wherein the structural units of the copolymer are represented by Formula (12):

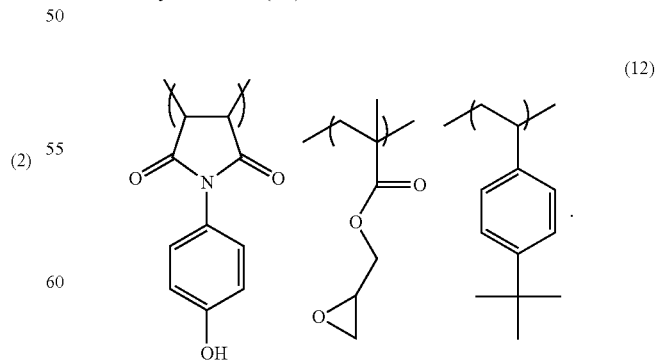

* * * * *